United States Patent [19]
Matsuo

[11] 3,970,946
[45] July 20, 1976

[54] DEMODULATOR FOR AMPLITUDE-AND-PHASE MODULATED SIGNALS HAVING CONTROL MEANS FOR REDUCING PHASE AND AMPLITUDE ERRORS

[75] Inventor: Yoshio Matsuo, Tokyo, Japan

[73] Assignee: Nippon Electric Company, Ltd., Tokyo, Japan

[22] Filed: July 10, 1974

[21] Appl. No.: 487,003

[30] Foreign Application Priority Data
July 12, 1973 Japan.............................. 48-79004

[52] U.S. Cl............................... 329/104; 329/132; 329/135; 329/136
[51] Int. Cl.²......................................... H03D 5/00
[58] Field of Search........... 329/104, 131, 134, 132, 329/135, 136; 325/320, 323, 347, 374, 375, 376; 178/88

[56] References Cited
UNITED STATES PATENTS
3,176,231  3/1965  Vallese et al. .................. 329/132 X
3,699,463  10/1972  Stone.............................. 329/135 X Primary Examiner—Siegfried H. Grimm
Attorney, Agent, or Firm—Ostrolenk, Faber, Gerb & Soffen

[57] ABSTRACT

Amplitude-and-phase modulated signals, as received, are represented by corresponding points on a reference signal plane of points to which results of demodulation, phase errors, and amplitude errors are preliminarily assigned. Responsive to the received signals, a detector produces position signals representative of the corresponding points. Responsive to the position signals, a demodulation and error-detection circuit produces result signals, phase error signals, and amplitude error signals representative of the results of demodulation, phase errors, and amplitude errors assigned to the corresponding points. Responsive to control signals specifying a predetermined area of the reference signal plane and to the position, phase error, and amplitude error signals, a selection circuit produces phase and amplitude control signals, which correct the reference signal plane to reduce the phase and amplitude errors of the position signals. After correction, the result signals become the demodulated signals.

13 Claims, 20 Drawing Figures

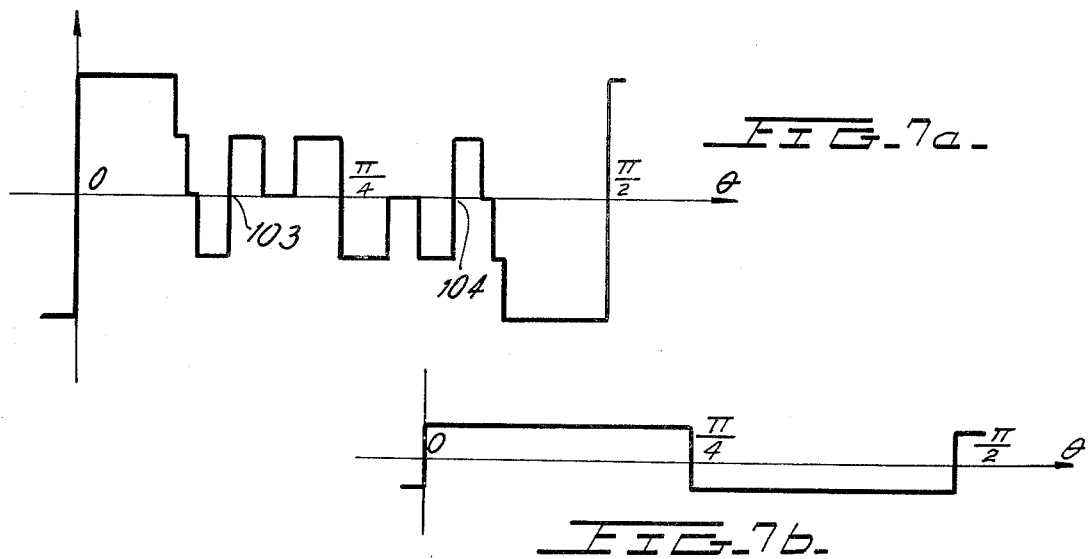
FIG. 7a.
FIG. 7b.
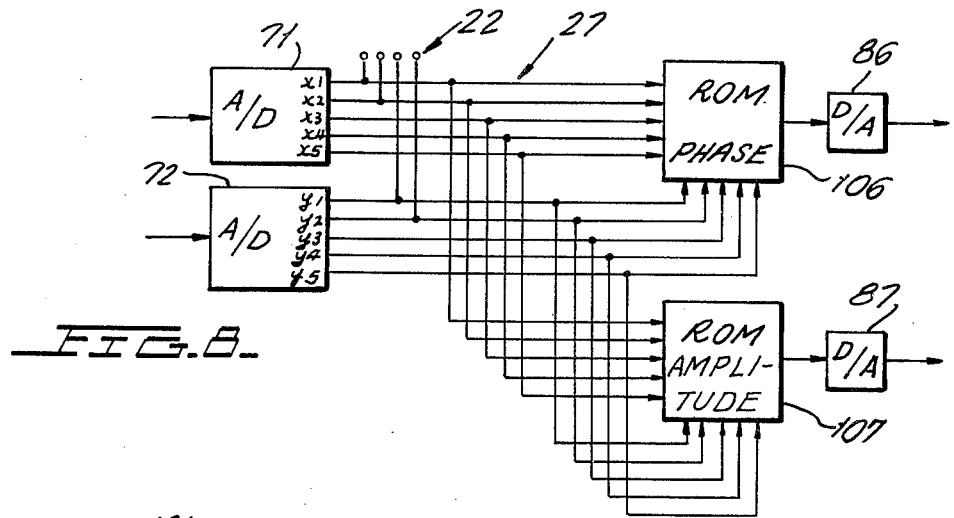
FIG. 8.
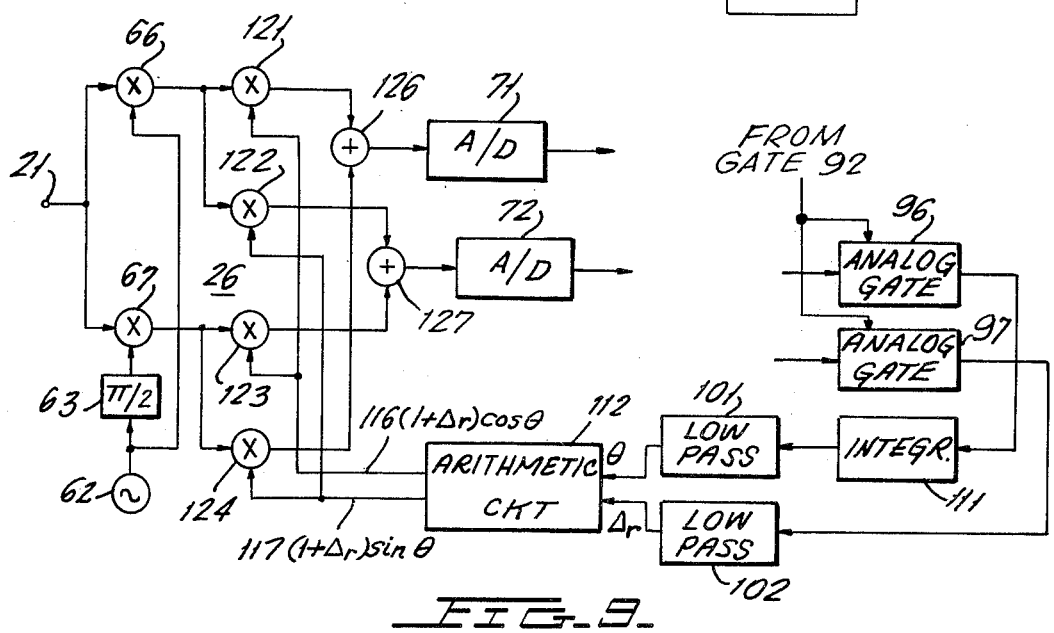
FIG. 9.

DEMODULATOR FOR AMPLITUDE-AND-PHASE MODULATED SIGNALS HAVING CONTROL MEANS FOR REDUCING PHASE AND AMPLITUDE ERRORS

BACKGROUND OF THE INVENTION

This invention relates to a demodulator for signals subjected to simultaneous amplitude and phase modulation.

Digital or analog information is usually transmitted with modulation effected thereby on a carrier signal. It has been conventional to modulate either the amplitude or the phase alone of the carrier signal by information. For digital information, four-phase phase modulation is frequently resorted to. The quantity of information transmitted by four-phase phase modulation, however, is only two bits per symbol. When the transmission route is of a nature such that the route has little noise although the passband is severely restricted, four-phase phase modulation is not effective. The efficiency is improved by increasing the number of phases to 8, 16, and so forth. For digital amplitude modulation, the efficiency is likewise improved with an increase in the number of amplitude levels from four to 8, 16, and so on. On the other hand, it is already known that simultaneous modulation of amplitude and phase raises the efficiency as compared with the modulation of amplitude or phase alone with the same number of bits per symbol used, if the numbers are pertinently apportioned between amplitude levels and phases. The simultaneous modulation may either be amplitude phase keying (APK) or quadrature amplitude modulation (QAM). For analog information, the simultaneous modulation may be pulse amplitude and phase modulation (PAPM) as presented by G. R. Welti in "Communications Présentées au Colloque International sur les Télécommunications Numériques par Satellite," Paris, 28–30 November 1972, under the title of "Pulse Amplitude-and-Phase Modulation". It is, however, necessary when demodulating the signals subjected to simultaneous amplitude and phase modulation to produce a reference signal on the receiving side, which serves as a phase reference synchronized with the original carrier signal used on the transmitting side and also as an amplitude reference proportional to the amplitude of the original carrier signal. Except for specific cases of amplitude phase keying, it is difficult to determine the phase reference from the received signals, as compared with determination of a similar phase reference from signals subjected solely to phase modulation. It is also difficult to determine the amplitude reference as compared with the case of sole amplitude modulation. The amplitude-and-phase modulation technique has accordingly been put into little practice, although it is an otherwise effective scheme.

SUMMARY OF THE INVENTION

It is therefore an object of the present invention to provide a demodulator for amplitude-and-phase modulated signals, making it feasible to resort to amplitude-and-phase modulation on transmitting digital or analog information.

It is another object of this invention to provide a demodulator of the type described, capable of determining a phase reference and an amplitude reference on a receiving side from received signals with excellent precision and efficiency.

As will later be described with reference to the accompanying drawings, the amplitude-and-phase modulated signals as sent out from a transmitting end are given by a plurality of information points placed on a signal plane at positions predetermined with respect to an amplitude scale and a phase reference given by an original carrier signal used on the transmitting side. Transmission of the amplitude-and-phase modulated signals to a receiving side through a transmission route basically includes transmission of the signal plane. Signals received at the receiving side are therefore represented by a plurality of signal points placed on a received signal map or plane whose amplitude scale and phase reference are subjected to variation during transmission through the transmission route. It is, however, possible to consider on the receiving side a reference signal plane, as called herein, on which a plurality of information points corresponding to the information points of the signal plane, as sent out at the transmitting end, are placed in consideration of a predetermined amplitude scale and a predetermined phase reference. It is now possible in accordance with this invention to check the signal points with reference to the information points placed on the reference signal plane for determination of the information carried by the signal points and to estimate the discrepancy that is usually present between the received signal map and the reference signal plane. It is also possible in accordance with this invention to match the reference signal plane to the received signal map to thereby cancel the discrepancy, namely, to bring the former into coincidence with the latter.

It is, therefore, to a reference signal plane that reference is had on demodulating with a demodulator according to this invention received signals that have been subjected to amplitude-and-phase modulation. The reference signal plane has points to which results of demodulation are preliminarily assigned in consideration of a predetermined amplitude scale and a predetermined phase reference. The demodulator comprises a detector comprising, in turn, first means responsive to the received signals for producing position signals representative of signal points corresponding to the received signals on the reference signal plane. The reference signal plane also has points to which phase errors and amplitude errors of the position signals are preliminarily assigned. The demodulator further comprises a demodulation and error-detection circuit responsive to the position signals for producing result signals, phase error signals, and amplitude error signals representative of those results of demodulation, phase errors, and amplitude errors which are assigned to the signal points; means for producing control signals specifying a predetermined area of the reference signal plane; and a selection circuit responsive to the control, position, phase error, and amplitude error signals for producing those selected phase and amplitude error signals which are representative of the phase and amplitude errors assigned to the points placed in the predetermined area. The detector mentioned above further comprises second means responsive to the selected phase and amplitude error signals for varying the amplitude scale and the phase reference to reduce the phase and amplitude errors represented by the phase and amplitude error signals. The result signals now become the demodulated signals.

The reference signal plane may be divided into a plurality of discrimination domains in correspondence to the respective results of demodulation, with the same result of demodulation assigned to all points in each of the discrimination domains. The reference signal plane may further be divided into a plurality of discrete, or digital, control domains, which may either be different from or coincident with the discrimination domains. When use is made of the control domains, the predetermined area may be predetermined at least once. The reference signal plane may be provided with a pair of separately predetermined areas, one for the phase errors and the other for the amplitude errors, specified by corresponding control signals. The predetermined area and accordingly the control signals may be invariant with respect to time. It is, however, preferred that the control signals should specify during presence, or possible presence, of a large discrepancy between the received signal map and the reference signal plane that the predetermined area be of a small size, such as an area placed near the origin of the reference signal plane, in which it is relatively easy to correctly estimate the discrepancy. The control signals may specify an area of a growing size subsequently with the progress of convergence of the phase and amplitude errors. Alternatively, the area size may automatically be increased with a lapse of time. The latter scheme is convenient in burst communication systems. Incidentally, it would have already been understood that the control means as termed in the title of this invention comprises the control signal producing means and the selection circuit.

BRIEF DESCRIPTION OF THE DRAWING

FIGS. 7 (a) and (b) show phase control signals produced in the demodulator according to the first embodiment, without and with control means for reducing phase and amplitude errors represented by phase and amplitude error signals;

FIG. 8 is a block diagram of a modified portion of the demodulator depicted in FIG. 4;

FIG. 9 is a block diagram of another modified portion of the demodulator shown in FIG. 4;

DESCRIPTION OF THE PREFERRED EMBODIMENTS

Figure 1:
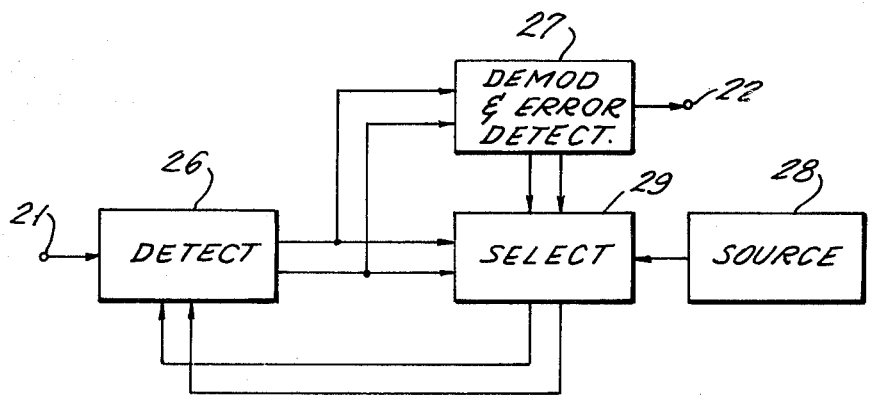
FIG. 1 is a block diagram of a demodulator according to the instant invention.

Referring to FIG. 1, a demodulator according to the present invention is adapted for demodulating amplitude-and-phase modulated signals received at an input terminal 21 to produce demodulated signals at an output terminal 22 which may comprise a plurality of terminals in practice. The demodulation is carried out with reference to a reference signal plane described in the preamble of the instant specification. The demodulator comprises a detector 26 for producing a reference signal and, responsive to this reference signal and the received signals, position signals representative of signal points corresponding on the reference signal plane to the received signals. Inasmuch as it is generally possible to represent the points on a plane with two coordinate components for each of the points, the detector 26 has two output terminals. The coordinates may be orthogonal, polar, or other coordinates. The demodulator further comprises a demodulation and error-detection circuit 27 responsive to the position signals for producing result, phase error, and amplitude error signals representative of those results of demodulation, phase errors, and amplitude errors which are preliminarily assigned to the signal points, a source 28 of control signals mentioned in the preamble of this specification, and a selection circuit 29 supplied with the control signals from the source 28, the position signals from the detector 26, and the phase and amplitude error signals from the demodulation and error-detection circuit 27 for producing those selected phase and amplitude error signals as phase and amplitude control signals which are representative of the phase and amplitude errors of the points in the predetermined area of the reference signal plane specified by the control signals. Responsive to the phase and amplitude control signals, the detector 26 rotates the reference signal plane and either lengthens or shortens the plane, namely, varies the amplitude scale and the phase reference to reduce the phase and amplitude errors represented by the phase and amplitude error signals.

Figure 2A:
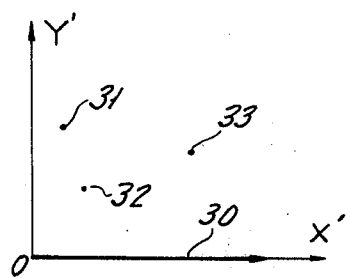
FIGS. 2 (a) and (b) are signal space diagrams of signals subjected to amplitude-and-phase modulation.
Figure 2B:
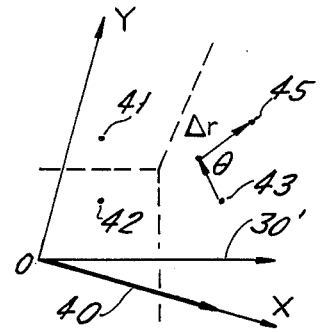

FIG. 2 (a) shows the phases and amplitudes of transmitted signals on an orthogonal X'—Y' coordinate plane, which is called a signal space diagram in the art and, more briefly, a signal plane herein. A vector 30 drawn along the X' axis shows the original carrier signal. In the manner known in the art, points 31, 32, and 33 have certain phase and amplitude relationships to an amplitude scale and a phase reference given by the carrier signal 30 and are called information points. In accordance with the information to be transmitted resorting to amplitude-and-phase modulation, the transmitter selectively transmits signals representative of the points 31 through 33 to a receiving end through a transmission route. Transmission of the information points 31 through 33 results in reception on the receiving side of certain signal points which may likewise be given on a received signal map or plane.

Referring to FIG. 2 (b), a received signal map refers to a certain amplitude scale and a phase reference. The amplitude scale and phase reference may be given by an abstract signal 30' which may be called a reconstituted carrier signal because the phase thereof must be synchronized with the original carrier signal 30. It is possible on the receiving side to know the signal points. It is, however, impossible from the beginning to reconstitute the carrier signal 30' and consequently to know the amplitudes and phases represented by the signal points. A reference signal plane is now considered on the receiving side, which is also depicted in FIG. 2 (b), with the use of an X-Y coordinate plane. The reference signal plane is a phase-amplitude plane vectorially representative of the amplitudes and phases of information points 41, 42, and 43 with reference to a predetermined amplitude scale and a predetermined phase reference which may also be represented by an abstract reference signal 40. The relationships between the information points 41 through 43 and the reference signal 40 are similar to those between the information points 31 through 33 on the transmitted signal plane to the original carrier signal 30. It is to be noted here that the reference signal 40 is resorted to merely in order to facilitate an understanding of the reference signal plane and need not be produced in the form described here in a demodulator according to this invention. The received signal map does not generally coincide with the reference signal plane. It is nevertheless possible to investigate the distances between a signal point 45 and the information points 41 through 43. This makes it possible to most probably determine which of the amplitudes and phases represented by points 31 through 33 the received signal had. In addition, it is possible from the positions of the received signals on the reference signal plane to estimate the discrepancy between the reference signal plane and the received signal map and to correct the discrepancy by rotating the reference signal plane and either lengthening or shortening the amplitude scale in consideration of the estimated discrepancy. More particularly, it is determined in the example being illustrated that the received signal is representative of the information given by the information point 43. The determination may be carried out by dividing the reference signal plane into three domains by three perpendicular bisectors of the distances between the points 41 through 43 and by judging in which of the three domains the signal point 45 is present. The bisectors and the domains will herein be called discrimination boundaries and discrimination domains. Speaking in other words with the use of this terminology, the received signal may be given that information as a result of demodulation which is represented by the information point 41, 42, or 43 corresponding to the information point 31, 32, or 33 on the transmitting side. The correction of the discrepancy is carried out by rotating the X-Y coordinate axes to minimize a phase error $\theta$ and lengthening in the example being illustrated the amplitude scale in consideration of an amplitude error $\Delta r$. Provided that the signal point 45 be not subjected to noises, the correction results in coincidence of the reference signal plane with the received signal map. Should the signal point 45 be subjected to noises, it is feasible to precisely estimate the amplitude scale and phase reference of the reference signal plane because the noises generally become zero thereon on the average.

As described with reference to FIGS. 2 (a) and (b), it is generally possible to derive in response to the positions of the received signals on a reference signal plane the results of demodulation, the phase errors, and the amplitude errors, if results of demodulation, phase errors, and amplitude errors are preliminarily assigned to the points on the reference signal without limitation on the manner of the preliminary assignment to those described with reference to FIGS. 2 (a) and (b).

Figure 3A:
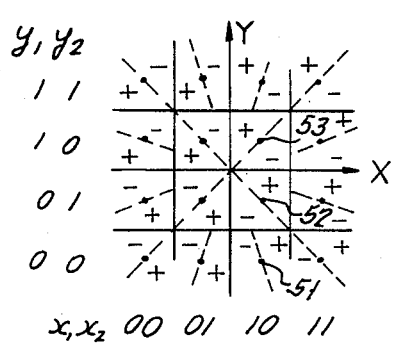
FIGS. 3 (a) and (b) show a reference signal plane for quadrature amplitude modulation.
Figure 3B:
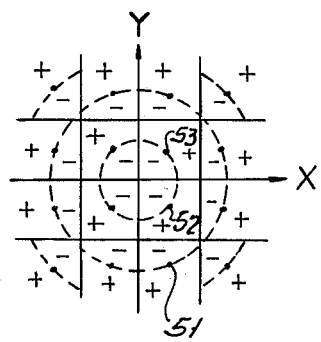

FIGS. 3 (a) and (b) show a reference signal plane for use in demodulating signals subjected to quadrature amplitude modulation. In the example shown, the plane has 16 information points, such as 51, 52, and 53, placed as depicted around the origin O of an orthogonal X-Y coordinate system with reference to a predetermined amplitude scale and at phases of arcsin $(1/\sqrt{10})$, $\pi/4$, ... with respect to a predetermined phase reference. The discrimination domains are partitioned by six discrimination boundaries, of which two are the X and Y axes. Inasmuch as the number of the information points are 16, it is possible to preliminarily assign the domains to that information transmitted with four bits per symbol which may be represented by permutations of four digital codes $(x_1 x_2 y_1 y_2)$. For example, the information points 51, 52, and 53 are representative of code permutations (1000), (1001), and (1010). The phase and amplitude errors may be assigned to the points on the plane as exemplified in FIGS. 3 (a) and (b). More particularly, each domain is subdivided into two subdivisions by a line segment on which the relevant information point is present and either on which or on whose extension the origin O is placed. The phase errors may merely be given by leading and lagging phases (+) and (−), in compliance with which the plane should be rotated clockwise and counterclockwise. Each domain is further divided into two subdivisions by that arc of a circle having the center at the origin O, on which the pertinent information point is placed. The amplitude errors are given by plus (+) and minus (−), in accordance with which the amplitude scale should be shortened and lengthened by radially contracting and expanding the plane.

Figure 4:
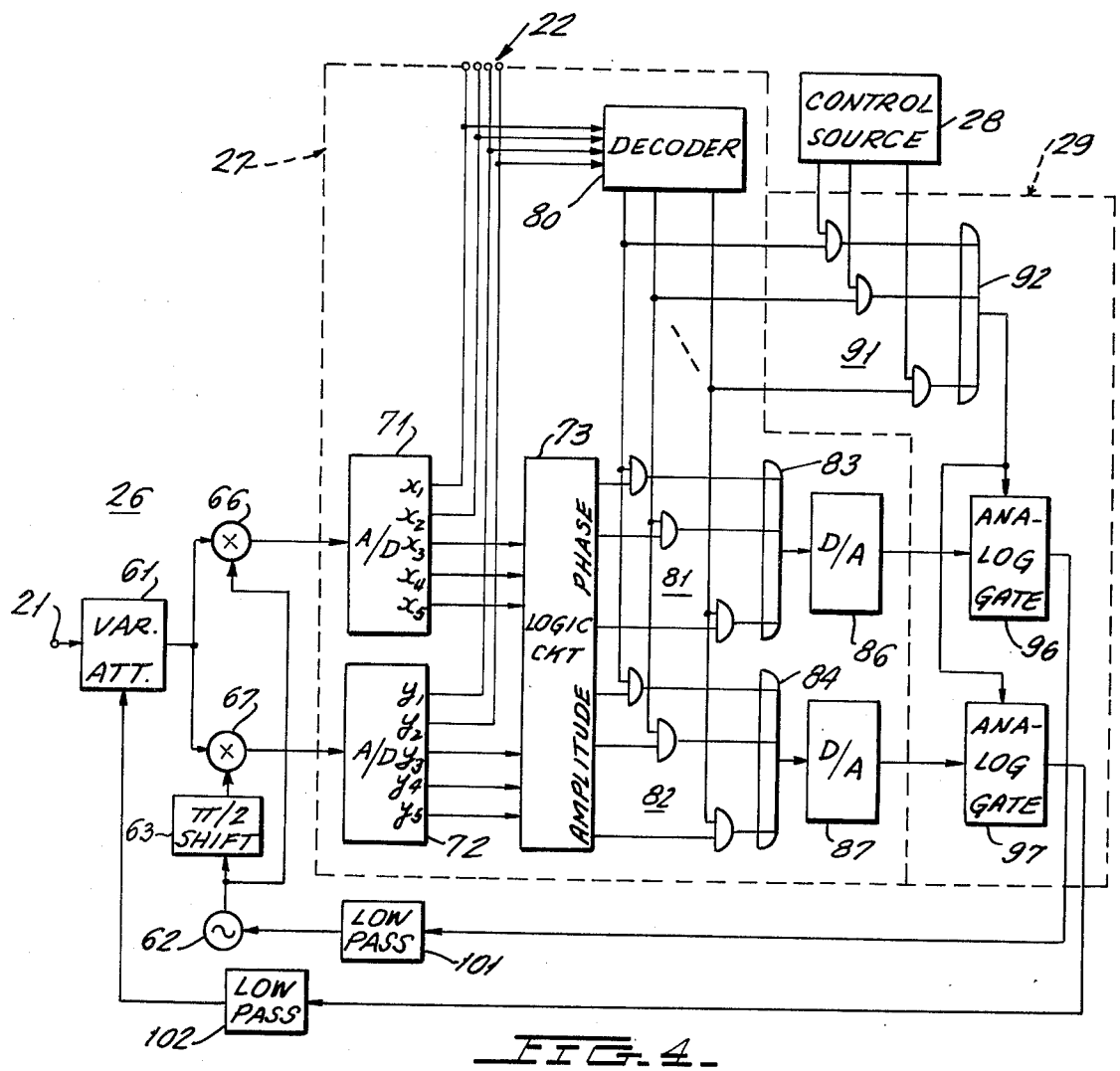
FIG. 4 is a block diagram of a demodulator according to a first embodiment of this invention.

Referring now to FIG. 4, a demodulator according to a first embodiment of this invention is utilized for demodulating signals subjected to quadrature amplitude modulation with sixteen information points illustrated in FIGS. 3 (a) and (b). The demodulator accordingly carries out the demodulation with the use of the reference signal plane described with reference to FIGS. 3 (a) and (b). The detector 26 of the demodulator comprises a variable attenuator 61 for varying the amplitude of the signals received at the input terminal 21 to derive amplitude adjusted received signals; a voltage controlled oscillator 62 for generating a local signal, a phase shifter 63 for shifting the phase of the local signal by $\pi/2$, and a first and a second product detector 66 and 67. The first detector 66 is connected to the attenuator 61 and oscillator 62 and produces those components of the received signals which are in inphase relation to the local signal. The second detector 67 is connected to the attenuator 61 and the phase shifter 63 and produces quadrature-phase components of the received signals. The inphase and quatrature-phase components are X and Y components of radius vectors representative of the received signals on a reference signal plane having the X axis along the local signal. In other words, the detectors 66 and 67 produce the position signals. The demodulation and error-detection circuit 27 of the demodulator comprises a first and a second analog-to-digital converter 71 and 72, respectively, for converting the respective inphase and quadrature-phase components to five-bit digital position signals $(x_1 x_2 x_3 x_4 x_5)$ and $(y_1 y_2 y_3 y_4 y_5)$. Conversion into five-bit signals means quantization of the coordinate plane into $2^5$ divisions along each of the X and Y axes. Likewise, selection of two more significant digits $(x_1x_2)$ or $(y_1y_2)$ of each five-bit signal is equivalent to selection of those four major divisions, each containing eight of the $2^5$ divisions along each of the X and Y axes, which are the discrimination domains illustrated with reference to FIGS. 3 (a) and (b). Each combination of these two-bit signals therefore gives a result of demodulation. The demodulation and error-detection circuit 27 further comprises a logic circuit 73 supplied with the remaining three least significant digits $(x_3x_4 x_5)$ or $(y_3y_4y_5)$ of each five-bit signal for producing phase and amplitude error signals in the manner described hereunder.

Figure 5:
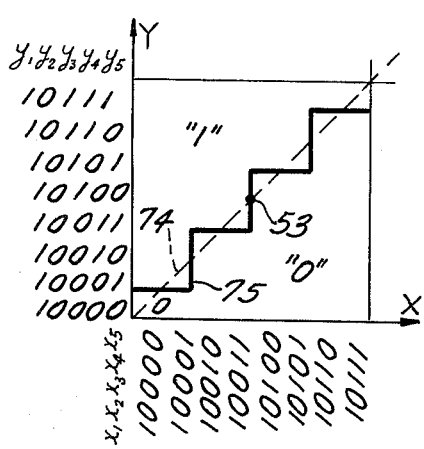
FIG. 5 shows a manner of assigning phase errors to one of the discrimination domains of the reference signal plane illustrated in FIGS. 3 (a) and (b)

Referring temporarily to FIG. 5, one of the discrimination domains of FIGS. 3 (a) and (b) in which the information point 53 is present corresponds to a combination of the more significant two-bit digital position signals (10) and (10). As described with reference to FIG. 3 (a), this discrimination domain is subdivided by a line segment 74 into a leading and a lagging phase area. It is, however, impossible with the quantized coordinates to derive precise phase error signals. The line segment 74 is now simulated by a stepped line 75. When the position signals fall in the upper left area relative to line 74, the phase error may be represented by a digital "1" signal, which may be a positive voltage. Otherwise, the phase error may be represented by a digital "0" signal, which may be a negative voltage.

Figure 6:
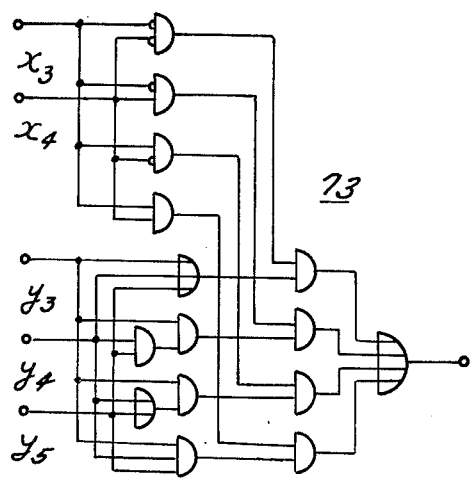
FIG. 6 shows a portion of a logic circuit for producing phase error signals representative of the phase errors illustrated with reference to FIG. 5.

Referring to FIG. 6, a portion of the logic circuit 73 for detecting the phase errors in the discrimination domain illustrated with reference to FIG. 5 comprises a plurality of AND and OR gates connected as shown, some of which have inhibit input terminals. When supplied with the least significant three digits ($x_5$ being unnecessary for this particular discrimination domain), the logic circuit portion produces the logic "1" and "0" signals representative of the desired phase errors. It is possible by increasing the number of bits of the output digital signal to give not only the sign of the phase errors but also the absolute values thereof. It will now be understood that the logic circuit 73 is capable of similarly producing other phase error signals and the amplitude error signals of the individual discrimination domains.

Returning to FIG. 4, the demodulator further comprises a decoder 80 supplied with the more significant two-bit signals $(x_1x_2y_1y_2)$ to produce a digital "1" signal on only one of sixteen output conductors in compliance with that one of the 16 discrimination domains in which the received signal represented by each of the two-bit signals is present. Although depicted in the demodulation and error-detection circuit 27 in FIG. 4, the decoder 80 is used also to supply the result signals, as significant portions of the position signals, from the detector 26 to the selection circuit 29. The demodulation and error-detector circuit 27 still further comprises sixteen first AND gates 81 enabled one at a time by the output signals of the decoder 80 for enabling the phase error signals to pass therethrough from the logic circuit 73, 16 second AND gates 82 likewise enabled by the decoder output signals for enabling the amplitude error signals pass therethrough, a first and a second OR gate 83 and 84 for the phase and amplitude error signals, and a first and a second digital-to-analog converter 86 and 87 for converting the digital phase and amplitude error signals to analog phase and amplitude error signals. The selection circuit 29 comprises sixteen AND gates 91 enabled by at least one predetermined one of the sixteen control signals supplied from the control signal source 28 for selectively enabling at least one of the output signals of the decoder 80 to pass therethrough, an OR gate 92 for passing the selected decoder output signal or signals, and a first and a second analog gate 96 and 97 enabled by the selected decoder output signal or signals for feeding those analog phase and amplitude error signals back to the detector 26 which are selected by the control signals. Besides the elements already described, the detector 26 further comprises a first and a second low-pass filter 101 and 102 for supplying the selected analog phase and amplitude error signals to the voltage controlled oscillator 62 and variable attenuator 61 as phase and amplitude control signals, respectively, with the high-frequency noise components removed from the error signals.

Referring to FIGS. 7 (a) and (b), wherein the abscissa represents the phase errors of the position signals and the ordinate represents the phase control signal, it is assumed for brevity of description that the 16 information points appear equally probably in the received signals and that the reference signal plane has already converged to the correct state as regards the amplitude scale. It is further presumed that the voltage controlled oscillator 62 is controlled so as to rotate the reference signal plane clockwise and counterclockwise when the phase control signal is positive and negative, respectively. The oscillator 62 reaches stationary states when the phase error is equal to 0, $\pi/2$, $\pi$, $3\pi/2$, and $2\pi$, of which only 0 and $\pi/2$ are shown in FIGS. 7 (a) and (b). When the phase errors have converged to one of these stable phases, it is possible to carry out correct demodulation (the amplitude scale having already been optimally adjusted). In FIG. 7 (a), illustrating the relation between the phase errors and the phase control signal without the use of the control means, stable phases also appear at 103 and 104. If the phase errors have converged to these stable phase 103 and 104, it becomes impossible to carry out the desired demodulation. Convergence of the phase, errors to these undesirable stable phases 103 and 104 will very likely occur when the initial phase errors are between about arcsin ($1/\sqrt{10}$) and arcsin ($3/\sqrt{10}$) as will readily be understood by comparing FIG. 3 (a) with FIG. 7 (a). Once the phase errors have converged to these undesirable stable phases, it is difficult to correct the convergence to the desired stable phases. In contrast, it is possible as shown in FIG. 7 (b) to produce phase control signals whose sign varies only at $\pi/4$ between 0 and $\pi/2$ by selecting with the use of the control means only four discrimination domains situated around the origin O for production of the phase control signals although the level variation of the phase control signal before and after each of the stable phases O and $\pi/2$ becomes small (the open-loop gain becoming low). It is, however, undesirable under certain circumstances to neglect the phase errors given by other discrimination domains. For example, the voltage controlled oscillator 62 will be set into free oscillation when signal points fall in these other discrimination domains for a considerable duration of time. It is therefore preferred as described in the preamble of this specification to change the control signals to specify, for example, all discrimination domains once convergence of the phase errors is achieved. Inasmuch as the control signals may be changed in this manner by merely changing either some or all of digital "0" control signals to digital "1" control signals or the voltage of the analog control signals, the source 28 therefor may readily be manufactured.

Again referring to FIG. 4, the detector 26 may further comprise a known automatic level control circuit (not shown) coupled to the variable attenuator 61 for automatically maintaining that mean electric power of the attenuator output signal constant which is detected by means therefor on the output side of the variable attenuator 61. Provision of such an automatic level control circuit is feasible even when the variable attenuator is interposed between the oscillator 62 on the one hand and the first detector 66 and phase shifter 63 on the other hand rather than between the input terminal 21 and the detectors 66 and 67.

Referring to FIG. 8, the demodulator illustrated with reference to FIGS. 3 through 7 is modified by substituting a first and a second read-only memory 106 and 107, each comprising a decoder (not shown) and 1024 words × 1 bit capacity memory locations, for the logic circuit 73, the decoder 80 used for the demodulation and error-detection circuit 27, and the gates 81 through 84. The 1024 memory cells or locations correspond to the $2^5 \times 2^5$ divisions of the reference signal plane specified by the five-bit digital position signals and store phase or amplitude error signals representative of the phase or amplitude errors assigned to these divisions. The five-bit signals are therefore supplied to both read-only memories 106 and 107 as address signals for specifying that one of the memory cells at a time from which the phase and amplitude error signals should be delivered to the digital-to-analog converters 86 and 87. When a read-only memory of 1024 words × 4 bits capacity is substituted for each of the memories described above, it is possible to derive an error signal capable of assuming one of 16 values to provide approximately linear control.

Referring to FIG. 9, the detector 26 of the demodulator according to the first embodiment may comprise an oscillator 62 for generating a local signal of a fixed frequency approximately equal to the carrier frequency resorted to on the transmitting side, a phase shifter 63 illustrated in conjunction with FIG. 4, a first and a second product detector 66 and 67 for producing the inphase and quadrature-phase components of the signals received at the input terminal 21, an integrator 111 for integrating the selected phase error signals to deliver phase-adjusted phase error signals to the first low-pass filter 101, and an arithmetic circuit 112 responsive to adjusted phase control signal $\theta$ and the amplitude control signal $\Delta r$ from the respective low-pass filters 101 and 102 for delivering factor signals representative of $(1 + \Delta r)\cos\theta$ and $(1 + \Delta r)\sin\theta$ on its two output conductors 116 and 117. The detector 26 further comprises a complex multiplier comprising, in turn, four multipliers 121 through 124 and two adders 126 and 127 connected as shown for multiplying one at a time a complex number whose real and imaginary parts are given by the output signals of the first and second detectors 66 and 67 by another complex number whose real and imaginary parts are given by the factor signals to deliver the real and imaginary parts of the complex product to the first and second analog-to-digital converters 71 and 72 of the demodulation and error-detection circuit 27. With the X and Y axes of the reference signal plane deemed to be the real and imaginary axes, the complex multiplication is equivalent to rotation of the reference signal plane by an angle $\theta$ and correction of the amplitude scale by a factor $(1 + \Delta r)$. Use is made of the integrator 111 to cancel a static phase difference which is generally inevitable between the local signal produced by the fixed-frequency oscillator 62 and the original carrier signal.

Figure 10:
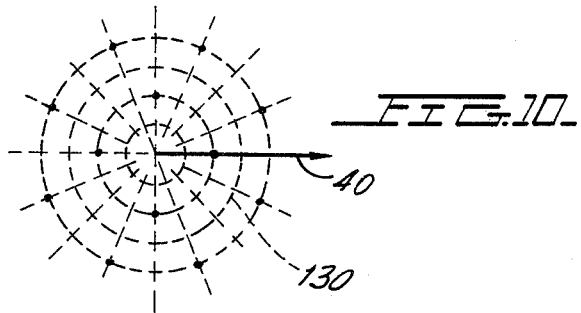
FIG. 10 shows a reference signal plane for amplitude phase keying.

Referring now to FIG. 10, a reference signal plane for amplitude phase keying has, by way of example, four information points spaced a predetermined distance from the origin or pole O and $\pi/2$ each from a fixed or initial line and eight information points spaced twice the predetermined distance from the origin O and $\pi/4$ each on both sides of the fixed line in the manner depicted. It is now convenient to use a polar coordinate system. The amplitude scale and phase reference may be given by a vector 40 drawn on the fixed line. In order to assign the amplitude and phase errors to the reference signal plane points, the plane is divided by concentric circles of radii differing by a half of the predetermined distance and straight lines angularly successively spaced by $\pi/8$ from the fixed line or vector 40. Inasmuch as the numbers of subdivisions thereby provided on the plane in the radial and phase directions are 5 and 16, it is necessary to represent a radius vector and its argument by a three-bit and a four-bit digital signal $(r_1 r_2 r_3)$ and $(\theta_1 \theta_2 \theta_3 \theta_4)$. Incidentally, the four and eight signal points are placed on both sides of a circle 130 whose radius is (011).

Figure 11:
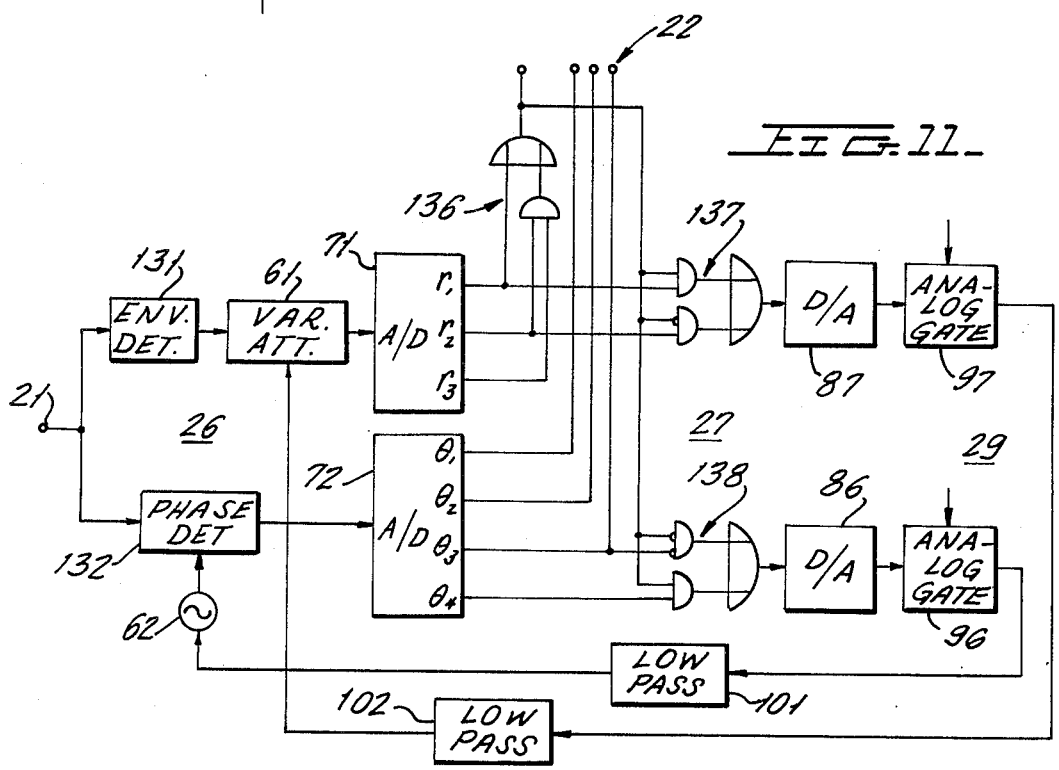
FIG. 11 is a partial block diagram of a demodulator according to a second embodiment of this invention.

Referring to FIG. 11, a demodulator according to a second embodiment of this invention is adapted for demodulating signals subjected to amplitude phase keying illustrated with reference to FIG. 10. The detector 26 of the demodulator comprises a variable attenuator 61 controlled by the amplitude control signal, a voltage controlled oscillator 62 controlled by the phase control signal for producing a local signal, an envelope detector 131 supplied with the received signals from the input terminal 21 for delivering the amplitude components of the received signals to the attenuator 61, and a phase detector 132 responsive to the local signal and the received signals for producing the phase components of the latter with a 360° linearity. The demodulation and error-detection circuit 27 of the demodulator comprises a first and a second analog-to-digital converter 71 and 72 for converting the amplitude and phase components to three-bit radius vector signals and four-bit argument digital signals. It is possible to determine that side of the circle 130 in which a signal point is placed, by checking whether a result of a logic operation $(r_1 + r_2 \cdot r_3)$ is logic "1" or "0." A first combination 136 of an OR and an AND gate carries out this logic operation to supply an amplitude or radius vector signal to one of the output terminals 22. Similarly, a second combination 137 of gates supplies an amplitude error signal representative of the amplitude error of the amplitude signal to the second digital-to-analog converter 87 illustrated with reference to FIG. 4. The phase or argument signal point is given by a combination of the three more significant digits of each phase signal and is delivered to three of the output terminals 22. The phase error of the phase signal is represented by a phase error signal supplied by a third combination 138 of gates to the first digital-to-analog converter 86.

Figure 12A:
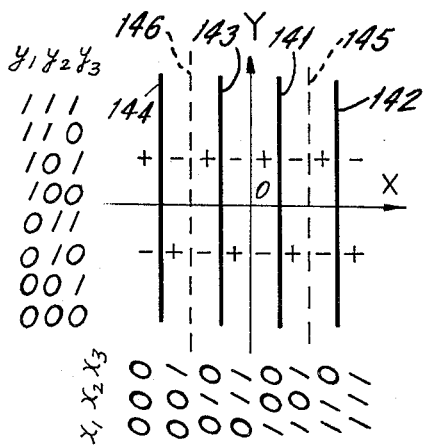
FIGS. 12 (a) and (b) show a reference signal plane for pulse amplitude-and-phase modulation.
Figure 12B:
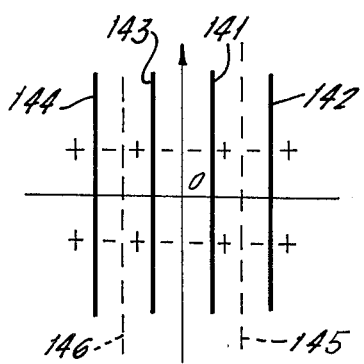

Referring to FIGS. 12 (a) and (b), a reference signal plane for pulse amplitude and phase modulation is depicted together with the phase and amplitude errors + and − representative of their polarities alone as in FIGS. 3 (a) and (b). In pulse amplitude and phase modulation, first through fourth straight line segments 141, 142, 143, and 144 drawn perpendicular to the X axis and equally spaced on both sides of the Y axis are called "segments." Each of the segments may be looked upon as a continuation of information points described in conjunction with FIGS. 2, 3, and 10. In other words, information is transmitted as pulses which are discrete with respect to time as in quadrature amplitude modulation and amplitude phase keying but have continuous amplitudes as in analog transmission. The instantaneous voltage resulting from sampling the information is generally related to the amplitude and phase of a pulse as follows. When the instantaneous voltage is zero, the amplitude and phase are given by a point placed at the bottom of the first segment 141. As the voltage increases in the positive sense, the amplitude and phase of a pulse vary upwards along the first segment 141 to the top and subsequently along the second segment 142 from the bottom to the top. As the voltage increases in the negative sense, the amplitude and phase of a pulse vary along the third segment 143 from the top to the bottom and then likewise along the fourth segment 144. Pulse amplitude and phase modulation is thus capable of transmitting the information with a narrower operating passband of frequencies as compared with quadrature amplitude modulation and amplitude phase keying and is less adversely affected by noises as compared with amplitude modulation. The demodulation may be carried out at first by determining in which of the discrimination domains divided by the Y axis and straight line discrimination boundaries 145 and 146 the X component of a received signal is present. It is to be noted that the expression "discrimination domain" is used here in a broad sense because the information is given by continuous line segments rather than by discrete points. In any event, the discrimination carried out determines on which of the segments 141 through 144 the signal point is. Subsequently, a sum is derived by adding the voltage represented by the bottom point of the pertinent segment to the voltage represented by the Y component of the received signal. In compliance with the four segments 141 through 144, the reference signal plane may be divided into eight subdivisions along the X axis. Accordingly, each of the segments 141 through 144 may be divided into eight subdivisions along the Y axis.

Figure 13:
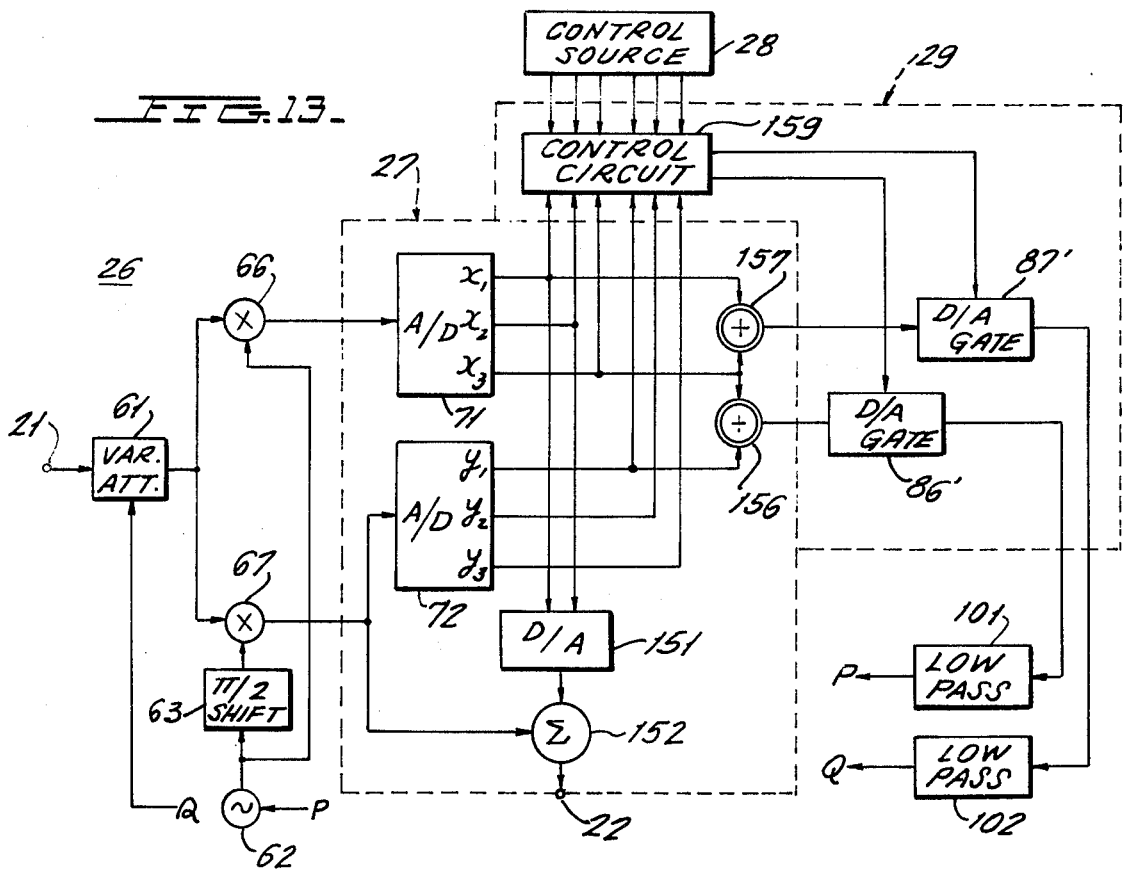
FIG. 13 is a block diagram of a demodulator according to a third embodiment of this invention.

Referring to FIG. 13, a demodulator according to a third embodiment of this invention is adapted for demodulating signals subjected to pulse amplitude and phase modulation illustrated with reference to FIGS. 12 (a) and (b). The detector 26 of the demodulator comprises elements designated with like reference numerals as in the first embodiment. The analog-to-digital converters 71 and 72 of the demodulation and error-detection circuit 27 convert the X and Y component analog signals to three-bit digital position signals $(x_1x_2x_3)$ and $(y_1y_2y_3)$ in correspondence to the eight subdivisions along each of the X and Y axes. As will readily be acknowledged from FIGS. 12 (a) and (b), the discrimination domain in which the pertinent segment is present is represented by those two more significant digits of the X component digital signal. The demodulation and error-detection circuit 27 therefore comprises a segment bottom digital-to-analog converter 151 responsive to the two more significant digits of each X component digital signal for producing a voltage representative of the bottom point of the pertinent segment, and an adder 152 responsive to the output signal of the digital-to-analog converter 151 and the Y component analog signal to deliver the result signal to the output terminal 22. As will also be seen from FIG. 12 (a), the phase error signal is given by an exclusive OR of the least significant digit of the X component digital signal and the most significant digit of the Y component digital signal. FIG. 12 (b) will readily reveal that the amplitude error signal is given by an exclusive OR of the most and least significant digits of the X component digital signal. Consequently, the demodulation and error-detection circuit 27 further comprises a first and a second exclusive OR gate 156 and 157 for supplying the phase and amplitude error signals to the digital-to-analog converters 86' and 87', which are, in the example being illustrated, controlled by position signals decoded and selected at a control circuit 159 by the control signals for phase and amplitude errors supplied from the source 28 for producing the selected phase and amplitude error signals. The control circuit 159 may readily be realized by a combination of the demodulator 80, AND gates 91, and OR gate 92 described in conjunction with the first embodiment.

Figure 14A:
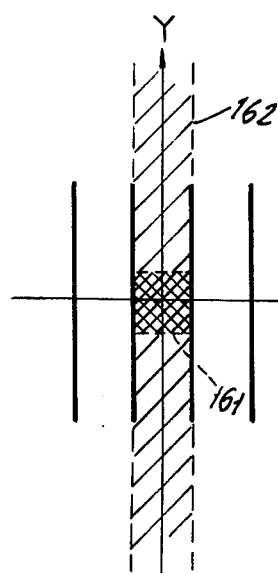
FIGS. 14 (a) and (b) show a reproduction of the reference signal plane shown in FIGS. 12 (a) and (b), together with separate control domains for the phase and amplitude errors.

Referring to FIG. 14 (a), the control signals for phase errors preferably specify a cross-hatched phase error control area 161 of the reference signal plane in which the initial phase errors are or may presumably be large. After the phase errors converge to a certain small value, the control signals for phase errors may specify a broader phase error control area 162 including the initial control area 161. Subsequently, the control signals for phase errors may specify all of the reference signal plane.

Referring to FIG. 14 (b), the control signals for amplitude errors may specify at first an amplitude error control area 166 during which the phase errors of the position signals are or may possibly large. After convergence of the phase errors, the control signals for amplitude errors may specify the whole reference signal plane. This is because the amplitude errors of the position signals given by subdivisions placed more remote from the X axis on both sides thereof are more liable to misdetection of the amplitude errors during presence or possible presence of large phase errors.

Figures 14B, 15:
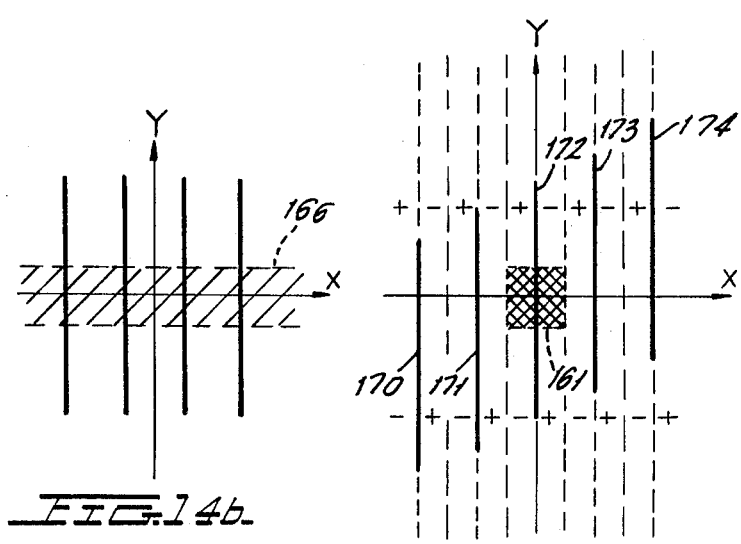
FIG. 15 shows another reference signal plane for pulse amplitude-and-phase modulation, together with phase errors assigned to the points on the plane and control domains for the phase errors.

Referring finally to FIG. 15, another reference signal plane for pulse amplitude and phase modulation has an odd number of stepwise arranged segments 170 through 174 on which the information points are mapped with the zero instantaneous voltage given by the origin O. This arrangement of the segments 170 through 174 enables the transmission to be carried out with a high efficiency of signal power when the amplitudes of information have a gaussian distribution. The phase errors are assigned to the subdivisions as indicated with + and −. With the gaussian distribution of the information amplitude, the received signals most likely appear in the smallest phase error control area 161, such as was described with reference to FIG. 14 (a). This enables the correction of the phase reference to be carried out even with the control signals for phase errors kept specifying the smallest phase error control area 161, although extensions of the area along the Y axis at first and thereafter along the X axis is also desirable even in this case.

What is claimed is:

1. A demodulator for deriving demodulated signals from received signals which have been subjected to amplitude-and-phase modulation, comprising:
   a detector comprising first means responsive to said received signals for producing position signals representative of signal points corresponding to said received signals on a reference signal plane of points to which results of demodulation, phase errors of said position signals, and amplitude errors of said position signals are preliminarily assigned in consideration of a predetermined amplitude scale and a predetermined phase reference;

a demodulation and error-detection circuit responsive to said position signals for producing result signals, phase error signals, and amplitude error signals representative of those results of demodulation, phase errors, and amplitude errors which are assigned to said signal points;

means for producing control signals specifying a predetermined area of said reference signal plane; and a selection circuit responsive to said control, position, phase error, and amplitude error signals for producing those selected phase and amplitude error signals which are representative of the phase and amplitude errors assigned to the points placed in said predetermined area;

said detector further comprising second means responsive to said selected phase and amplitude error signals for varying said amplitude scale and phase reference to reduce the phase and amplitude errors represented by said phase and amplitude error signals, said result signals thereby becoming said demodulated signals.

2. A demodulator as claimed in claim 1, wherein:

said first means comprises a voltage controlled oscillator for generating a reference signal and means responsive to said reference and received signals for producing said position signals, said reference signal defining said predetermined phase reference; and said second means comprises means responsive to said selected phase error signals for controlling said oscillator to vary the phase of said reference signal and means responsive to said selected amplitude error signals for varying the amplitudes of said received signals, thereby varying said amplitude scale and phase reference.

3. A demodulator as claimed in claim 2, wherein:

said amplitude varying means comprises a variable attenuator responsive to said selected amplitude error signals and received signals for producing amplitude adjusted received signals and said position signal producing means comprises product detector means responsive to said reference signal and amplitude adjusted received signals for producing said position signals.

4. A demodulator as claimed in claim 2, wherein:

said position signal producing means comprises an envelope detector responsive to said received signals for producing amplitude signals representative of the amplitude components of said received signals and a phase detector responsive to said reference and received signals for producing phase signals representative of the phase components of said received signals and said amplitude varying means comprises a variable attenuator responsive to said amplitude signals and selected amplitude error signals for producing adjusted amplitude signals, said adjusted amplitude signals and said phase signals giving said position signals.

5. A demodulator as claimed in claim 1, said received ignal being the result of amplitude-and-phase modulation of a carrier signal having a predetermined carrier frequency, each of the points on said reference signal plane being given by a real and an imaginary part of a complex number, wherein:

said first means comprises an oscillator for producing a reference signal of a fixed frequency approximately equal to said carrier frequency and said second means comprises arithmetic circuit means responsive to said selected phase and amplitude error signals for producing a pair of factor signals representative of factors by which the real and imaginary parts of said points on said reference signal plane should be multiplied to reduce the phase and amplitude errors represented by said phase and amplitude error signals;

said first means further comprising complex product detector means responsive to said received signal, said reference signal, and said factor signals for producing real and imaginary part signals representative of real and imaginary part components of said position signals.

6. A demodulator as claimed in claim 1, wherein said demodulation and error-detection circuit comprises:

analog-to-digital converter means responsive to the position signals produced by said first means for producing digital position signals;

means responsive to predetermined digits of said digital position signals for producing said result signals; and means responsive to said digital position signals for producing said phase and amplitude error signals.

7. A demodulator as claimed in claim 6, said position signals comprising abscissa and ordinate signals, each pair of said abscissa and ordinate signals being representative of the abscissa and ordinate of an orthogonal coordinate system for giving the position of a point on said reference signal plane, wherein:

said analog-to-digital converter means comprises a first analog-to-digital converter for converting said abscissa signals to abscissa digital signals representative of quantized abscissae of said signal points and a second analog-to-digital converter for converting said ordinate signals to ordinate digital signals representative of quantized ordinates of said signal points, said abscissa and ordinate digital signals serving as said digital position signals.

8. A demodulator as claimed in claim 7, wherein:

said result signal producing means comprises a plurality of conductors connected to said first and second analog-to-digital converters for deriving a predetermined number of more significant digits of each of said abscissa and ordinate digital signals, said more significant digits of said abscissa and ordinate digital signals serving as said result signals.

9. A demodulator as claimed in claim 7, wherein:

said result signal producing means comprises a digital-to-analog converter responsive to predetermined more significant digits of said abscissa digital signals for producing abscissa analog signals and an adder responsive to said ordinate signals and abscissa analog signals for producing said result signals.

10. A demodulator as claimed in claim 6, said position signals comprising radius vector and argument signals, each pair of said radius vector and argument signals being representative of the radius vector and argument of a polar coordinate system for giving the positions of a point on said reference signal plane, wherein:

said analog-to-digital converter means comprises a first analog-to-digital converter for converting said radius vector signals to radius vector digital signals representative of quantized radius vectors of said signal points and a second analog-to-digital converter for converting said argument signals to argument digital signals representative of quantized arguments of said signal points, said radius vector and argument digital signals serving as said position signals; and said result signal producing means comprises gate means responsive to said radius vector digital signals for producing quantized radius vector signals and a plurality of conductors connected to said second analog-to-digital converter for deriving predetermined more significant digits of said argument digital signals, said quantized radius vector signals and said more significant digits of said argument digital signals serving as said result signals.

11. A demodulator as claimed in claim 6, wherein:
said phase and amplitude error signal producing means comprises logic circuit means responsive to said digital position signals for producing digital phase and amplitude error signals and digital-to-analog converter means responsive to said digital phase and amplitude error signals for producing said phase and amplitude error signals in analog form.

12. A demodulator as claimed in claim 6, wherein:
said phase and amplitude error producing means comprises a pair of read-only memories, each comprising a plurality of memory locations accessible by said digital position signals, one of said memories storing said phase errors in said memory locations, the other of said memories storing said amplitude errors in said memory locations, said memories addressed by said digital position signals producing said phase and amplitude error signals representative of the phase and amplitude errors stored in the addressed memory locations.

13. A demodulator as claimed in claim 1, said control signals comprising a plurality of digital control signals, wherein:

said demodulation and error-detection circuit comprises analog-to-digital converter means responsive to the position signals produced by said first means for producing digital position signals representative of quantized coordinates of said signal points and said selection circuit comprises means responsive to said digital control and digital position signals for producing a gate signal and gate means responsive to said gate signal and said phase and amplitude error signals for producing said selected phase and amplitude error signals.

* * * * *